US011374661B2

(12) United States Patent
Gopalan et al.

(10) Patent No.: US 11,374,661 B2
(45) Date of Patent: Jun. 28, 2022

(54) GENERALIZED VIRTUAL PIM MEASUREMENT FOR ENHANCED ACCURACY

(71) Applicant: NOKIA TECHNOLOGIES OY, Espoo (FI)

(72) Inventors: Ramasamy Gopalan, Irving, TX (US); Linjie Leng, Flower Mound, TX (US); Sylwester Kominek, Wroclaw (PL); Arnaud Pierrard, Nozay (FR)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/973,810

(22) PCT Filed: Jun. 13, 2018

(86) PCT No.: PCT/US2018/037292
§ 371 (c)(1),
(2) Date: Dec. 10, 2020

(87) PCT Pub. No.: WO2019/240787
PCT Pub. Date: Dec. 19, 2019

(65) Prior Publication Data
US 2021/0175983 A1 Jun. 10, 2021

(51) Int. Cl.
*H04B 17/18* (2015.01)
*H04B 17/19* (2015.01)
(Continued)

(52) U.S. Cl.
CPC ............ *H04B 17/18* (2015.01); *G01R 23/20* (2013.01); *H04B 17/0085* (2013.01); *H04B 17/19* (2015.01)

(58) Field of Classification Search
CPC combination set(s) only.
See application file for complete search history.

(56) References Cited

U.S. PATENT DOCUMENTS

| 9,768,812 B1* | 9/2017 | Tsui | H04B 17/0085 |
| 9,826,263 B2* | 11/2017 | Zinevich | H04L 1/206 |
| 2014/0119197 A1* | 5/2014 | Maca | H04B 17/327 |
| | | | 370/241 |

FOREIGN PATENT DOCUMENTS

WO    WO 2019/011422 A1    1/2019

OTHER PUBLICATIONS

International Search Report and Written Opinion dated Feb. 18, 2019 corresponding to International Patent Application No. PCT/US2018/037292.

(Continued)

*Primary Examiner* — Junpeng Chen
(74) *Attorney, Agent, or Firm* — Squire Patton Boggs (US) LLP

(57) ABSTRACT

An apparatus, method and work product is disclosed. The method comprises measuring plural transmit signals and corresponding receive signals and determining, using a model describing a relation between each of the plural transmit signals and a respective passive intermodulation signal, a standardized passive intermodulation signal as one or more nth order intermodulation products for a standardized transmit signal consisting of two tones each of a power of substantially 20 Watts. The method may also comprise identifying in the model one or more $n^{th}$ order cross-intermodulation products resulting from three or more transmit signals having different respective carrier frequencies. Responsive to the identification, the method may comprise adapting the standardized two-tone passive intermodulation signal by determining an offset for producing an adapted two-tone standardized passive intermodulation signal, n is an odd integer greater than two.

21 Claims, 10 Drawing Sheets

(51) Int. Cl.
   *G01R 23/20*   (2006.01)
   *H04B 17/00*   (2015.01)

(56) References Cited

OTHER PUBLICATIONS

Dmitry S. Kozlov et al., "Passive Intermodulation of Analog and Digital Signals on Transmission Lines with Distributed Nonlinearities: Modelling and Chararacterization," IEEE Transactions on Microwave Theory and Techniques, vol. 64, No. 5, May 1, 2016, pp. 1383-1395, XP011609620.
3GPP TR 37.808 V12.0.0 (Sep. 2013), Technical Report, 3rd Generation Partnership Project; Technical Specification Group Radio Access Network; Passive Intermodulation (PIM) handling for Base Stations (BS) (Release 12), Sep. 28, 2013, pp. 1-27, XP051293179.
European Office Action issued in corresponding European Patent Application No. 18 740 374.6-1206 dated May 12, 2022.

* cited by examiner

FIG. 12

| | | min num of carriers (M) | X1 | X2 | freq | f1 | f2 | f3 | f4 | IMn_freq | IMn_amp (indicated in markers) | Offset (simulated) | Offset (theoretical) |
|---|---|---|---|---|---|---|---|---|---|---|---|---|---|
| IM3 | \|X1\|^2*X1 | 2 | f1, f2 | | 2*f1-f2 | 20 | 30 | | | 10 | -9.03 | 0.00 | 0.00 |
| IM3_C1 | X2*X1*X1 | 3 | f1 | f2 | 2*f1-f2 | 20 | 30 | | | 10 | -9.03 | 0.00 | 0.00 |
| IM3_C2 | \|X2\|^2*X1 | 3 | f1 | f2, f3 | f1+f2-f3 | 20 | 50 | 60 | | 10 | -14.32 | -5.29 | -5.28 |
| IM5True | \|X1\|^4*X1 | 2 | f1 | f2 | 3*f1-2*f2 | 30 | 40 | | | 10 | -15.06 | 0.00 | 0.00 |
| IM5Cross1 | \|X2\|^4*X1 | 3 | f1 | f2, f3 | f1+2*f2-2*f3 | 20 | 35 | 40 | | 10 | -23.87 | -8.81 | -8.80 |
| IM5Cross2 | \|X1\|^4*X2 | 3 | f1, f2 | f3 | 2*f1+f3-2*f2 | 35 | 40 | 20 | | 10 | -23.88 | -8.82 | -8.80 |
| IM5Cross3 | X1*X1*X2*\|X1\|^2 | 3 | f1, f2 | f3 | 3*f1-f2-f3 | 30 | 35 | 45 | | 10 | -23.87 | -8.81 | -8.80 |
| IM5Cross4 | X1*X1*X2*\|X2\|^2 | 3 | f1 | f2, f3 | 2*f1+f2-2*f3 | 35 | 20 | 40 | | 10 | -23.87 | -8.81 | -8.80 |
| IM5Cross5 | X2*\|X2\|^2*\|X1\|^2 | 4 | f1, f2 | f3, f4 | f1+2*f3-f4-f2 | 20 | 40 | 45 | 60 | 10 | -30.11 | -15.05 | -15.05 |
| IM5Cross6 | \|X1\|^2*\|X2\|^2*X1 | 4 | f1, f2 | f3, f4 | 2*f1+f3-f2-f4 | 45 | 40 | 20 | 60 | 10 | -30.11 | -15.05 | -15.05 |

GENERALIZED VIRTUAL PIM MEASUREMENT FOR ENHANCED ACCURACY

FIELD

This specification relates to an apparatus, method and computer program product relating to the measurement of Passive InterModulation (PIM).

BACKGROUND

Passive InterModulation (PIM) is a well-known telecom issue. It is caused if plural signals are transmitted through a non-linear system. A non-linear system may be a system comprising active components, but non-linearity may also occur in passive components, usually at higher power than active components e.g. due to corroded connectors etc. If the non-linearity of passive components is severe, even low power may be sufficient to cause PIM. Due to PIM, intermodulation products occur at frequencies f corresponding to $k_a f_a + k_b f_b + k_c f_c + \ldots$, wherein $f_a$, $f_b$, $f_c$, ... are the frequencies of the plural signals, and $k_a$, $k_b$, $k_c$, ... are integer coefficients (positive, negative, or 0). The sum $k_a + k_b + k_c + \ldots$ is denoted as the order of the intermodulation product, denoted as IMP3, IMP5, IMP7 etc. for IMP of $3^{rd}$, $5^{th}$, and $7^{th}$ order, respectively. The amplitude of the IMPs decreases with increasing order of the IMPs. IMP3 is typically most relevant because it is located close to the input signal and has relatively high amplitude. If a broadband signal is transmitted through the non-linear system, PIM may cause the occurrence of side-lobes.

Cellular base stations may de-sense their own uplink owing to PIM products, for example introduced by passive components such as duplexers, cables, connector interfaces, antennas etc. Problems may get worse with the deployment of multi-band (wideband) cellular base stations or multiple co-sited base stations with carrier aggregation. If PIM is not mitigated, e.g. reduced or cancelled, it may not be possible to decode received signals. Operators may use PIM testers during site visits to measure PIM for mitigation purposes. PIM measurement is standardized in IEC62037. In this measurement, two tones each of 20 W are input into the non-linear system, the powers of the IMPs (e.g. IMP3, IMP5, and IMP7, higher order IMPs may be neglected) are measured, and the ratio of the power of IMP3 to the input power at carrier level is taken as a measure of PIM (PIM value). An issue with the standardized IEC 62037 2-tone signal test for PIM measurement, as it exists today, is that it requires expensive external equipment to perform the measurement. From a base station perspective, live traffic is also disrupted during the test time due to use of external equipment and the two input tones, leading to lost revenue for operators.

SUMMARY

A first aspect provides an apparatus, comprising:
means for measuring plural transmit signals and corresponding receive signals;
means for determining, using a model describing a relation between each of the plural transmit signals and a respective passive intermodulation signal, a standardized passive intermodulation signal as one or more nth order intermodulation products for a standardized transmit signal consisting of two tones each of a power of substantially 20 Watts;
means for identifying in the model one or more $n^{th}$ order cross-intermodulation products resulting from three or more transmit signals having different respective carrier frequencies; and
means responsive to the identification for adapting the standardized two-tone passive intermodulation signal by determining an offset for producing an adapted two-tone standardized passive intermodulation signal, wherein n is an odd integer greater than two.

The adaption means may be configured to calculate the offset by determining a minimum number of tones M required to generate the one or more $n^{th}$ order cross-intermodulation products and normalizing the total power of the M tones against the total power for the two tones of substantially 40 Watts.

The adaption means may determine the offset using:

$$IMPn_c \text{ Offset} = 10 \cdot \log_{10}\left(\left(\frac{2}{M}\right)^n\right)$$

where n is the intermodulation order.

The passive intermodulation signal may comprise at least one of true and cross intermodulation products 3rd order, true and cross intermodulation products of 5th order, and true and cross intermodulation products of 7th order, and the model comprises the respective at least one of:
True IMP3=TX_SIGNAL_F_1*|TX_SIGNAL_F_1|²;
Cross IMP3=TX_SIGNAL_F_1*|TX_SIGNAL_F_2|²;
True IMP5=TX_SIGNAL_F_1*|TX_SIGNAL_F_1|⁴;
Cross IMP5=TX_SIGNAL_F_1*|TX_SIGNAL_F_2|⁴; and
True IMP7=TX_SIGNAL_F_1*|TX_SIGNAL_F_1|⁶;
Cross IMP7=TX_SIGNAL_F_1*|TX_SIGNAL_F_2|⁶;
wherein:
IMP3, IMP5, and IMP7 are the intermodulation products of 3rd, 5th, and 7th order, respectively;
TX_SIGNAL_F_1 is a transmission signal of a first carrier frequency or first transmission band; and
TX_SIGNAL_F_2 is a transmission signal of a second, different carrier frequency or second, different transmission band.

The model may be a refined model derived by adapting at least one coefficient of a basic model describing a relation between each of the plural transmit signals and a respective passive intermodulation signal to obtain the refined model such that, in the refined model, a discrepancy between the receive signals and the corresponding passive intermodulation signals for the plural transmit signals is less than a predefined threshold, and wherein the standardized passive intermodulation system is calculated based on the refined model.

Each of the transmit signals may be fed into an antenna system, and the corresponding receive signal may be received from the antenna system when the respective transmit signal is fed into the antenna system.

The discrepancy may be at least one of a sum of the absolute values of differences between each of the receive signals and the corresponding passive intermodulation signal, a sum of the squares of the differences between each of the receive signals and the corresponding passive intermodulation signal, and a maximum of the differences between each of the receive signals and the corresponding passive intermodulation signal.

The adapting of the at least one coefficient may comprise at least one of a least mean square algorithm, a minimum mean square algorithm, and a recursive least square algorithm.

The transmit signals and the corresponding receive signals may be measured at a transceiver connected to the antenna.

The receive signals may be filtered by a receive filter with a receive filter function having a receive bandwidth located around a receive center frequency, and the transmit signals are comprised in a transmit band located around a transmit center frequency.

The transmit signals may be measured as an output of a transmit baseband module connected to the antenna system via a modulation unit, and the corresponding receive signals may be measured as an input of a receive baseband module connected to the antenna system via a demodulation unit.

The apparatus may further comprise means for applying the offset to produce the adapted two-tone standardized passive intermodulation signal and applying it to the one or more receive signals for mitigating passive intermodulation.

The apparatus may further comprise means for receiving the one or more transmit signals and corresponding receive signals from a remote radio apparatus and transmitting the offset or the adapted two-tone standardized passive intermodulation signal to the, or another, remote radio apparatus.

Another aspect relates to an apparatus comprising means for estimating PIM per IEC 62037 in real time without disrupting live traffic. Another aspect relates to an apparatus comprising means for diagnosing a passive intermodulation mechanism, e.g. triple tone, etc.

Another aspect provides a method, comprising:
 measuring plural transmit signals and corresponding receive signals;
 determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;
 identifying in the model one or more $n^{th}$ order cross-intermodulation products resulting from three or more transmit signals having different respective carrier frequencies; and
 responsive to the identification, adapting the standardized two-tone passive intermodulation signal by determining an offset for producing an adapted two-tone standardized passive intermodulation signal,
 wherein n is an odd integer greater than two.

Adapting may comprise calculating the offset by determining a minimum number of tones M required to generate the one or more $n^{th}$ order cross-intermodulation products and normalizing the total power of the M tones against the total power for the two tones of substantially 40 Watts.

The offset may be determined using:

$$IMPn_c \text{ Offset} = 10 \cdot \log_{10}\left(\left(\frac{2}{M}\right)^n\right)$$

where n is the intermodulation order.

The passive intermodulation signal may comprise at least one of true and cross intermodulation products 3rd order, true and cross intermodulation products of 5th order, and true and cross intermodulation products of 7th order, and the model comprises the respective at least one of:
 True IMP3=TX_SIGNAL_F_1*|TX_SIGNAL_F_1|$^2$;
 Cross IMP3=TX_SIGNAL_F_1*|TX_SIGNAL_F_2|$^2$;
 True IMP5=TX_SIGNAL_F_1*|TX_SIGNAL_F_1|$^4$;
 Cross IMP5=TX_SIGNAL_F_1*|TX_SIGNAL_F_2|$^4$; and
 True IMP7=TX_SIGNAL_F_1*|TX_SIGNAL_F_1|$^6$;
 Cross IMP7=TX_SIGNAL_F_1*|TX_SIGNAL_F_2|$^6$;
wherein
 IMP3, IMP5, and IMP7 are the intermodulation products of 3rd, 5th, and 7th order, respectively;
 TX_SIGNAL_F_1 is a transmission signal of a first carrier frequency or first transmission band; and
 TX_SIGNAL_F_2 is a transmission signal of a second, different carrier frequency or second, different transmission band.

The model may be a refined model derived by adapting at least one coefficient of a basic model describing a relation between each of the plural transmit signals and a respective passive intermodulation signal to obtain the refined model such that, in the refined model, a discrepancy between the receive signals and the corresponding passive intermodulation signals for the plural transmit signals is less than a predefined threshold, and wherein the standardized passive intermodulation system is calculated based on the refined model.

Each of the transmit signals may be fed into an antenna system, and the corresponding receive signal may be received from the antenna system when the respective transmit signal is fed into the antenna system.

The discrepancy may be at least one of a sum of the absolute values of differences between each of the receive signals and the corresponding passive intermodulation signal, a sum of the squares of the differences between each of the receive signals and the corresponding passive intermodulation signal, and a maximum of the differences between each of the receive signals and the corresponding passive intermodulation signal.

The adapting of the at least one coefficient may comprise at least one of a least mean square algorithm, a minimum mean square algorithm, and a recursive least square algorithm.

The transmit signals and the corresponding receive signals may be measured at a transceiver connected to the antenna.

The receive signals may be filtered by a receive filter with a receive filter function having a receive bandwidth located around a receive center frequency, and the transmit signals are comprised in a transmit band located around a transmit center frequency.

The transmit signals may be measured as an output of a transmit baseband module connected to the antenna system via a modulation unit, and the corresponding receive signals may be measured as an input of a receive baseband module connected to the antenna system via a demodulation unit.

The method may further comprise applying the offset to produce the adapted two-tone standardized passive intermodulation signal and applying it to the one or more receive signals for mitigating passive intermodulation.

The method may further comprise means for receiving the one or more transmit signals and corresponding receive signals from a remote radio apparatus and transmitting the offset or the adapted two-tone standardized passive intermodulation signal to the, or another, remote radio apparatus.

Another aspect may provide a work product, comprising a look up table or array, created by means of:

measuring plural transmit signals and corresponding receive signals;

determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;

identifying in the model one or more nth order cross-intermodulation products resulting from three or more transmit signals having different respective carrier frequencies; and responsive to the identification, adapting the standardized two-tone passive intermodulation signal by determining an offset for producing an adapted two-tone standardized passive intermodulation signal, wherein n is an odd integer greater than two.

Another aspect provides an apparatus, comprising at least one processor, at least one memory directly connected to the at least one processor, the at least one memory including computer program code, and the at least one processor, with the at least one memory and the computer program code being arranged to perform:

measuring plural transmit signals and corresponding receive signals;

determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;

identifying in the model one or more $n^{th}$ order cross-intermodulation products resulting from three or more transmit signals having different respective carrier frequencies; and responsive to the identification, adapting the standardized two-tone passive intermodulation signal by determining an offset for producing an adapted two-tone standardized passive intermodulation signal, wherein n is an odd integer greater than two.

Another aspect provides a computer program product comprising a set of instructions which, when executed on an apparatus, is configured to cause the apparatus to carry out a method, comprising:

measuring plural transmit signals and corresponding receive signals;

determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;

identifying in the model one or more $n^{th}$ order cross-intermodulation products resulting from three or more transmit signals having different respective carrier frequencies; and responsive to the identification, adapting the standardized two-tone passive intermodulation signal by determining an offset for producing an adapted two-tone standardized passive intermodulation signal, wherein n is an odd integer greater than two.

Another aspect provides a non-transitory computer readable medium comprising program instructions stored thereon for performing a method, comprising:

measuring plural transmit signals and corresponding receive signals;

determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;

identifying in the model one or more $n^{th}$ order cross-intermodulation products resulting from three or more transmit signals having different respective carrier frequencies; and responsive to the identification, adapting the standardized two-tone passive intermodulation signal by determining an offset for producing an adapted two-tone standardized passive intermodulation signal, wherein n is an odd integer greater than two.

Another aspect provides an apparatus comprising: at least one processor; and at least one memory including computer program code which, when executed by the at least one processor, causes the apparatus:

to measure plural transmit signals and corresponding receive signals;

to determine, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts;

to identify in the model one or more $n^{th}$ order cross-intermodulation products resulting from three or more transmit signals having different respective carrier frequencies; and responsive to the identification, to adapt the standardized two-tone passive intermodulation signal by determining an offset for producing an adapted two-tone standardized passive intermodulation signal, wherein n is an odd integer greater than two.

BRIEF DESCRIPTION OF THE DRAWINGS

Embodiments will now be described in detail with reference to the accompanying drawings, in which:

FIG. 1 shows an apparatus according to an example embodiment as part of a system;

FIG. 12 is a table showing simulated and theoretical results indicative of the performance of an example embodiment;

DETAILED DESCRIPTION

Figure 1:
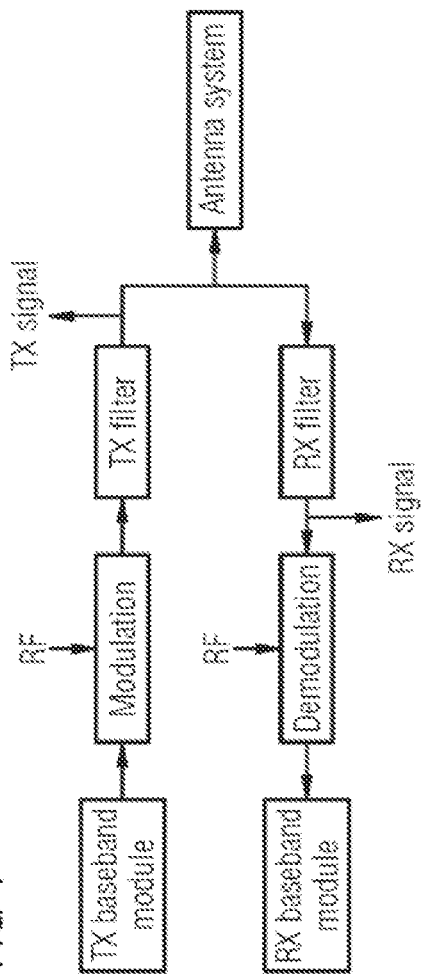
FIG. 1 shows a measurement arrangement to obtain RX signals and TX signals for use in some example embodiments.

Certain example embodiments are described in detail with reference to the accompanying drawings, wherein the features of the embodiments can be freely combined with each other unless otherwise described. However, it is to be expressly understood that the description of certain embodiments is given by way of example only, and that it is by no way intended to be understood as limiting to the disclosed details.

Moreover, it is to be understood that the apparatus is configured to perform the corresponding method, although in some cases only the apparatus or only the method are described. The operations of the method may be embodied in a computer program product on, for example, a non-transitory medium.

Certain abbreviations will be used herein, which are set out below for ease of reference.

Abbreviations

2G/3G/4G/5G $2^{nd}/3^{rd}/4^{th}/5^{th}$ Generation
3GPP $3^{rd}$ Generation Partnership Project
CD Compact Disc
CFR Crest Factor Reduction
DCS Digital Cellular System
DPD Digital Predistorsion
DVD Digital Versatile Disk
eNB, NB evolved NodeB
FDD Frequency Division Duplex
IEC International Electrotechnical Commission
IMP/IM Intermodulation Product
IMP3/IMP5/ . . . IMP of $3^{rd}$ order/$5^{th}$ order/ . . .
LMS Least Mean Square
MIMO Multiple Input-Multiple Output
MMS Minimum Mean Square
MSE Mean Squared Error
NL Non-linear
PIM Passive Intermodulation
RMS Recursive Mean Square
RF Radio Frequency
RX Receive
TX Transmit
UE User Equipment
UI User Interface
USB Universal Serial Bus
WiFi Wireless Fidelity Example embodiments herein enable to estimate PIM without the need for dedicated and expensive external equipment and without the need for taking the system being measured off-line. In other words, some example embodiments allow for estimating PIM in real time during normal operations of, for example, a base station (e.g. eNB or NB) using the regular transmitted signal and not a dedicated PIM test signal which would disrupt service. This overcomes issues due to the PIM varying over time, e.g. due to the slow natural degradation of the antenna system resulting from constant exposure to the elements. For example, as the antenna begins to rust over time its PIM performance naturally degrades. This degradation cannot be picked up by a one-time measurement.

Some example embodiments enable monitoring PIM during normal operation making real time evaluation of antenna system performance possible, even without the need for expensive equipment. Some embodiments enable this to be performed remotely, e.g. at a server or central network management system remote from the one or more antenna systems under test. PIM measurements may be used for PIM cancellation or mitigation purposes and/or for quality control purposes.

This disclosure describes example embodiments for virtual PIM measurement using a model.

This disclosure then describes a method for adapting the model to deal with cross-band and/or inter-band non-linear terms, i.e. terms in the model produced by the presence of multiple different carrier frequencies or multiple different transmit bands, which may otherwise compromise virtual PIM measurement. This adapting enables the model to be adapted for use in mitigating PIM that may occur in multi-carrier, multi-band (wideband) radio systems, such as, but not limited to, cellular base stations based on, for example, FDD technology.

According to some embodiments, a model of the PIM source behaviour may be built in software. An example model is:

$$PIM\_Signal = Alpha * Tx\_Signal * |Tx\_Signal|^2 + Beta * Tx\_Signal * |Tx\_Signal|^4$$

PIM_Signal denotes the signal resulting from PIM, Tx_Signal denotes the input signal to be transmitted through the non-linear system, and Alpha and Beta are complex coefficients scaling the IMP3 contribution $Tx\_Signal * |Tx\_Signal|^2$ and the IMP5 contribution $Tx\_Signal * |Tx\_Signal|^4$, respectively.

Other models may depend on only one order of IMP, or may comprise higher order IMPs or terms that are not linear in the IMP contributions. The model (i.e., the coefficients of the model; in the above model: Alpha and Beta) may be refined using a Least Mean Square or any other error limiting algorithm like MMS (Minimum Mean Square), RLS (Recursive Least Square) algorithms. As the Model becomes sufficiently accurate, the model is used to estimate what would be the result of the two tone tests as defined in IEC 62037. That is, the two tones of the IEC 62037 measurement are used as Tx-Signal in the model, and the resulting PIM_signal is used to calculate the PIM value as a quotient of the power of the PIM_signal and 20 W.

The PIM value can then be used in a PIM cancellation or reduction algorithm to prevent loss of decoding capability.

The frequencies of the two tones may be selected according to the RF system for which the PIM value is to be estimated. For example, for a DCS base station, the tones are selected out of the TX band between 1800 and 1880 MHz, and the RX signal is measured in the uplink band between 1710 and 1785 MHz. In one example, the two tones have frequencies of 1805 MHz and 1875 MHz and 20 Watts each. The PIM product is then at 1735 MHz. Typically, PIM varies slowly with the frequency such that a single measurement (estimation) may be sufficient in many cases.

The power of 20 W is at the carrier level (dBc), not the total transmitted power. For example, in the above described case, one may measure (estimate) a level of −110 dBm.

Thus, the ratio compared to the 20 Watts carrier (43 dBm) is −110 dBm−43 dBm=−153 dBc.

This means, according to some embodiments, the model is trained with the regular traffic transmitted by the non-linear system and the PIM value may be estimated in real time using the model thereby virtually duplicating the results which would've been performed using the 2-tone signal tests.

The non-linear system may be presented to e.g. a base station of an arbitrary radio access technology (e.g. 2G, 3G, 4G, or 5G of 3GPP, WiFi, or Bluetooth) or a corresponding terminal such as a UE.

In some embodiments, a PIM signal of a base station comprising a TX path and an RX path both connected to a joint antenna system is estimated. The antenna system may be a single antenna or plural antennas, e.g. in a MIMO configuration. The input signal TX_Signal to be transmitted may be a composite signal of plural signals within a TX band. The TX band is substantially centered around a transmit center frequency. In the model, the transmit center frequency is modelled as TX_FREQ.

The RX path may comprise a filter to pass (substantially) only signals of a RX band substantially centered around a receive center frequency, which is modelled as RX_FREQ. The RX band has a RX bandwidth modelled as FILTER_RX_BANDWIDTH.

The transmit signal and the receive signal are simultaneously captured. For example, existing features, such as digital spectrum analyzer or DPD of Nokia's base stations may be used to capture the TX signal and the RX signal. DPD is a radio algorithm in charge of predistorting the signal prior to the Power Amplifier. Thus, the output of the Power amplifier is the linearly amplified signal although one uses the Power amplifier in its non-linearity zone. An external spectrum analyzer may be used to capture the TX signal and the RX signal. It may be captured within the radio equipment or at the modulator/demodulator or system module. In this concept, a base station is split into system module and radio module, such that the system module corresponds to the core module of the base station and the modulator/demodulator module to the radio module of the base station. The captured signal may be stored in a memory of the base station and/or in a memory external to the base station such as the memory of the PIM analyzer if the PIM analyzer is separated from the base station. Thus, plural pairs of transmit signals and corresponding receive signals are obtained.

According to the model, the PIM signal may be generated from the transmit composite signal e.g. according to PIM_signal=$\alpha$*IMP3+$\beta$*IMP5+$\gamma$*IMP7+ . . . with:
IMP3=filter(frequency_shift (TX_SIGNAL*|TX_SIGNAL|$^2$, TX_FREQ-RX_FREQ), FILTER_RX_BANDWIDTH);
IMP5=filter(frequency_shif (TX_SIGNAL*|TX_SIGNAL|$^4$, TX_FREQ-RX_FREQ), FILTER_RX_BANDWIDTH);
IMP7=filter(frequency_shift (TX_SIGNAL*|TX_SIGNAL|$^6$, TX_FREQ-RX_FREQ), FILTER_RX_BANDWIDTH);
. . . ;

The term "filter" denotes a function corresponding to the receive filter function; and frequency shift denotes a function of a frequency shift.

Based on the plural pairs of TX signals and RX signals, the coefficients $\alpha$, $\beta$, and $\gamma$ may be determined. Going up to seventh order IMP is usually more than enough to model the third order IMP accurately, but in some embodiments, more or less intermodulation products of different orders may be taken into account.

As outlined above, in some embodiments, LMS may be used to adapt (tune) the coefficients. For LMS purpose, the intermodulation Model could be seen as a Matrix computation:

$$Y=[IMP3\ IMP3(z-1)IMP3(z-2)IMP5\ IMP5(z-1) \\ IMP5(z-2)IMP7\ IMP7(z-1)IMP7(z-2)] \quad (1)$$

where IMP3 IMP5 . . . are column vectors:

$$W = \begin{bmatrix} w0 \\ w1 \\ \ldots \\ wm \end{bmatrix}$$

is referred to as the coefficient vector. Each wi weights the corresponding column in (1).

PIM=$Y*W$.

Coefficients can be updated using Least Mean Square (LMS)technique:

$$W=(\text{hermitian\_transpose}(Y)\cdot Y)^{-1}\cdot(\text{hermitian\_transpose}(Y)\cdot\text{Receive Signal});$$

In an example:

PIM Model=$w0$*IMP3+$w1$*IMP5.

In this example, the IMP3 and IMP5 are just scaled by 1 tap coefficient (not a multi tap filter).
In a Matrix form:

$$\text{PIM\_MODEL}(1\text{ to }n) = \begin{bmatrix} [IMP_3(1) & IMP_5(1)] \\ [IMP_3(2) & IMP_5(2)] \\ \ldots & \ldots \\ [IMP_3(n) & IMP_5(n)] \end{bmatrix} * \begin{bmatrix} [Wo] \\ [W1] \\ \\ [Wn] \end{bmatrix}$$

In a more generic modeling, where the PIM is modelled using k NL terms (corresponding to IMP3 with taps, IMP5 with taps . . . ):

$$\text{PIM\_MODEL}(1\text{ to }n) = \begin{bmatrix} [NL_o(1) & NL_1(1) & \ldots & NL_{k-1}(1)] \\ [NL_o(2) & NL_1(2) & \ldots & NL_{k-1}(2)] \\ \ldots & & & \ldots \\ [NL_o(n) & NL_1(n) & \ldots & NL_{k-1}(n)] \end{bmatrix} * \begin{bmatrix} [W_o] \\ [W_1] \\ \\ [W_{k-1}] \end{bmatrix}$$

One may write this as a matrix PIM_MODEL=$A*w$, with A being the Nonlinear Matrix and w the coefficients of the column vector.

The error of PIM Model compared to the received signal RX is:
Error=PIM_Model−RX
Error=$A*w-RX$
Mean Squared Error:
MSE=$|A*w-RX|^2$
MSE=$(A*w-RX)^H*(A*w-RX)$
MSE=$(A*w)^H*(A*w)+RX^H*RX-RX^H*(A*w)-(A*w)^H*RX$
MSE=$w^H*A^T*A*w+RX^H*RX-RX^H*A*w-w^H*A^H*RX$ In order to minimize the Mean Squared Error, the derivative of MSE by $w^H$, i.e. Delta MSE/DeltaW$^H$ is considered:

Delta MSE/DeltaW$^H$=0

Delta MSE/DeltaW$^H$=w$^H$*A$^H$*A*w+RX$^H$*RX−RX$^H$*A*w−w$^H$*A$^H$*RX

Delta MSE/DeltaW$^H$=A$^H$*A*w−A$^H$*RX=0

A$^H$*A*w=(A$^H$*RX)

w=(A$^H$*A)$^{-1}$*(A$^H$*RX)

As noted above, according to some embodiments, other techniques such as MMS and RLS may be used to refine the model.

In some embodiments, the model is sufficiently refined if the discrepancy between the measured RX signal and the calculated PIM signal is smaller than a predefined threshold. A measure of the discrepancy may be e.g. a sum of the absolute values of differences between each of the receive signals and the corresponding PIM signal, a sum of the squares of the differences between each of the receive signals and the corresponding PIM signal; and a maximum of the differences between each of the receive signals and the corresponding PIM signal.

Figure 8:
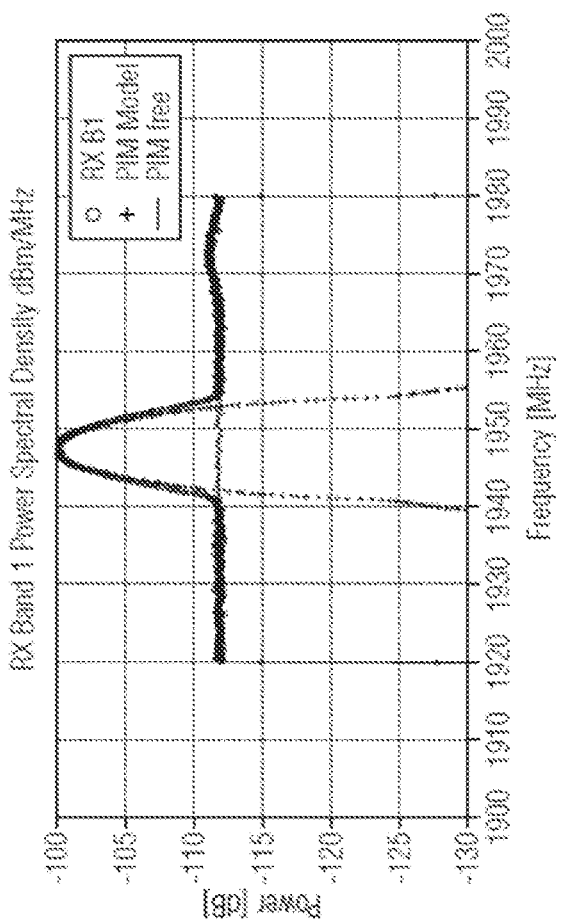
FIG. 8 shows spectra according to some example embodiments.

By the LMS algorithm (or any other correlation technique), the PIM signal may be separated from other signals embedded in the RX flow. This is shown in FIG. 8. The received RX signal is shown by circles "o". The modelling part (shown by crosses "+") is based on the TX signal and only correlates with the PIM part but not with the full RX signal. Thus, the RX signal without PIM may be separated from the total PIM signal (shown as a solid line): RX_SIG_PIM_Free (solid line)=RX_with_PIM (circles)−PIM_Model (crosses).

If the model is sufficiently refined, according to some embodiments, a two test tone of 20 W each is used as the transmit signal TX_SIGNAL in the model.

Then, the respective Y matrix is computed:

PIM result=$Y*W$

The W matrix are the nonlinear terms (IMP3, IMP5+taps) based on the ongoing traffic used to determine the set of w coefficients for minimizing the error or best approximating the model versus reality.

The W matrix composed of nonlinear terms may be built using a virtual traffic composed of two tone tests (virtual PIM tests), we determined due to the previous ongoing traffic. The set of w coefficients is used to make the model realistic.

We can now determine the impact of PIM in the RX band if we would transmit 2 tones (as according to the PIM Test defined in IEC 62037).

The passive intermodulation value gives the level of the IMP3 frequency distortion (i.e. the quotient of the power of IMP3 compared to 20 W input signal) for this system. Thus, the two test tone result is estimated without having performed the test and interrupting the traffic.

According to some embodiments, the signal output from the transceiver to the antenna and the signal received from the antenna after the receive band filter but before demodulation may be used as TX signal and RX signal, respectively. This is shown in FIG. 1. In some embodiments, instead of these signals, baseband signals may be used.

Figure 2:
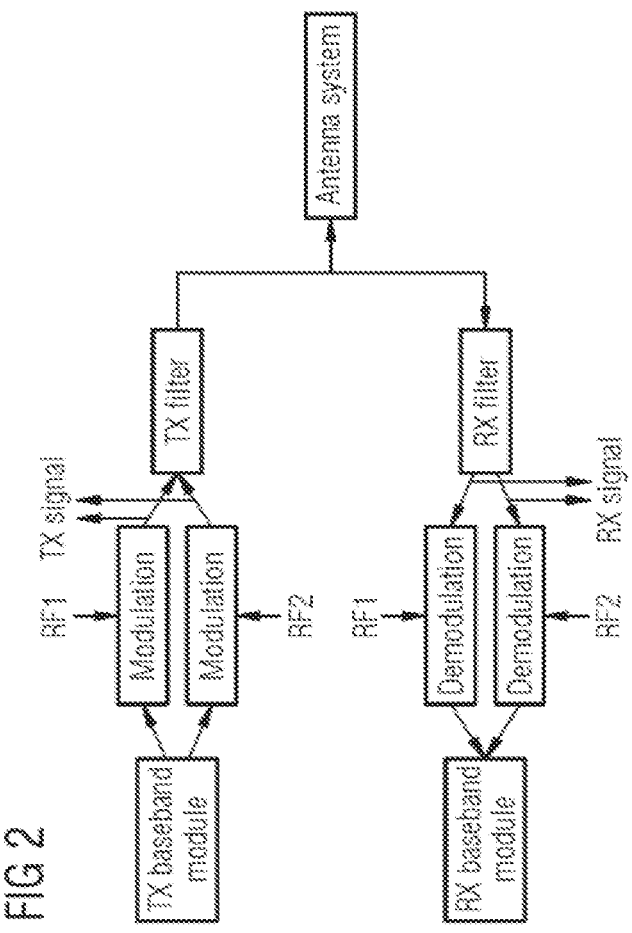
FIG. 2 shows a measurement arrangement to obtain RX signals and TX signals for use in some example embodiments.

A corresponding configuration is shown in FIG. 2. In FIG. 2, the impact on Rx carrier is based on the transmit carriers, it is still the same PIM Modeling but carrier based. One can predetermine where (at which frequency) the intermodulation product of the carrier combination will fall. So it is totally equivalent then with the W matrix based on non-linear terms based on carrier combination than composite signal of FIG. 1.

As shown in FIGS. 1 and 2, a composite signal generated by the TX baseband module modulates an RF signal in the modulation unit. The modulated signal may pass through a TX filter (optional) and is transmitted via the antenna system. This signal comprises IMP(s) which may be back-reflected in the antenna system such that it is received by the RX path. The RX path comprises a RX filter to pass substantially only the RX band. Then, the RX signal is demodulated and given to the RX baseband unit. The TX and RX signals for the modelling may both be modulated signals (FIG. 1) or both be baseband signals (FIG. 2).

Figure 3:
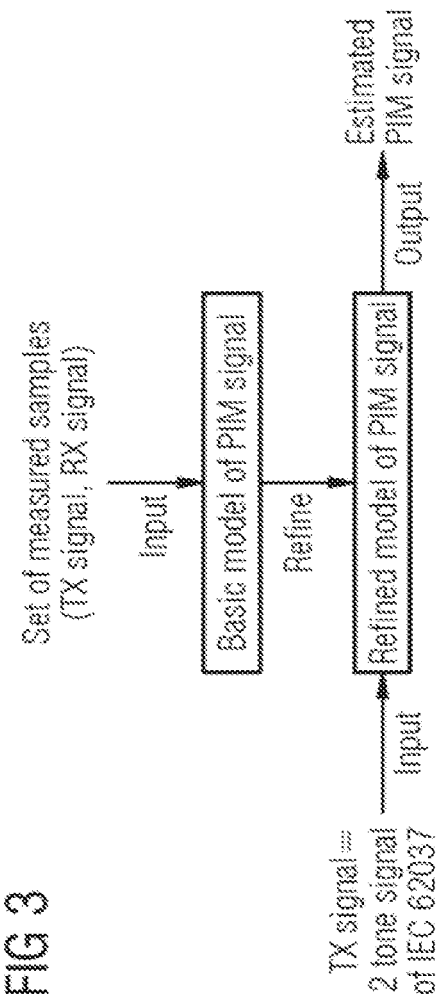
FIG. 3 shows a method according to some example embodiments.

As shown in FIG. 3 (alternative figures), the samples (TX signal, RX signal) obtained from these measurements may be input into the basic model of the PIM signal. The basic model may be refined based on the samples, i.e. the coefficients of the model may be adapted such that the model fits sufficiently to the measured samples. Then, the 2-tone signal of IEC 62037 is fed into the refined model. The output of the model is the PIM signal. Its IMP3 component may be used to calculate the PIM value.

Figure 9:
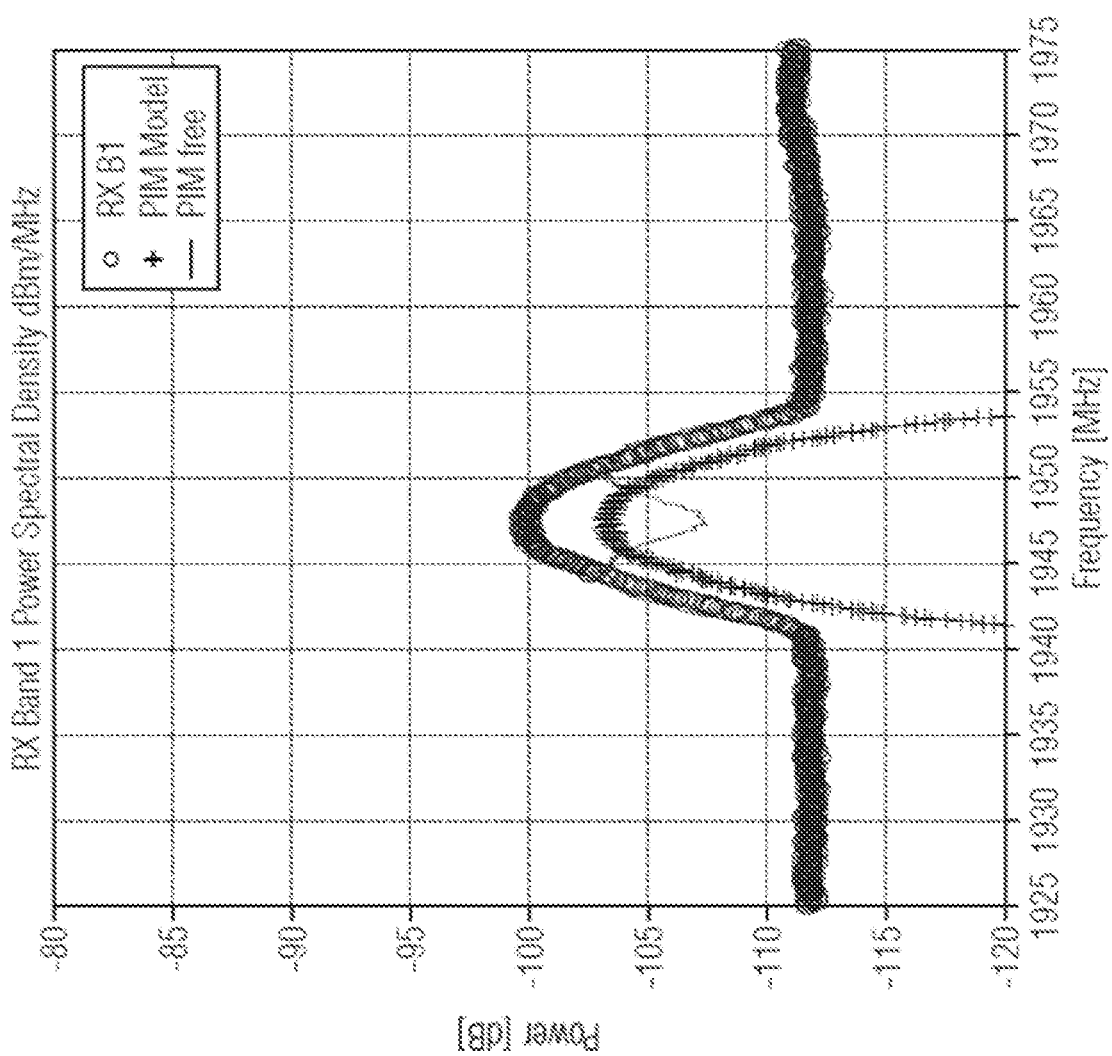
FIG. 9 shows a simulation of PIM without application of CFR.
Figure 10:
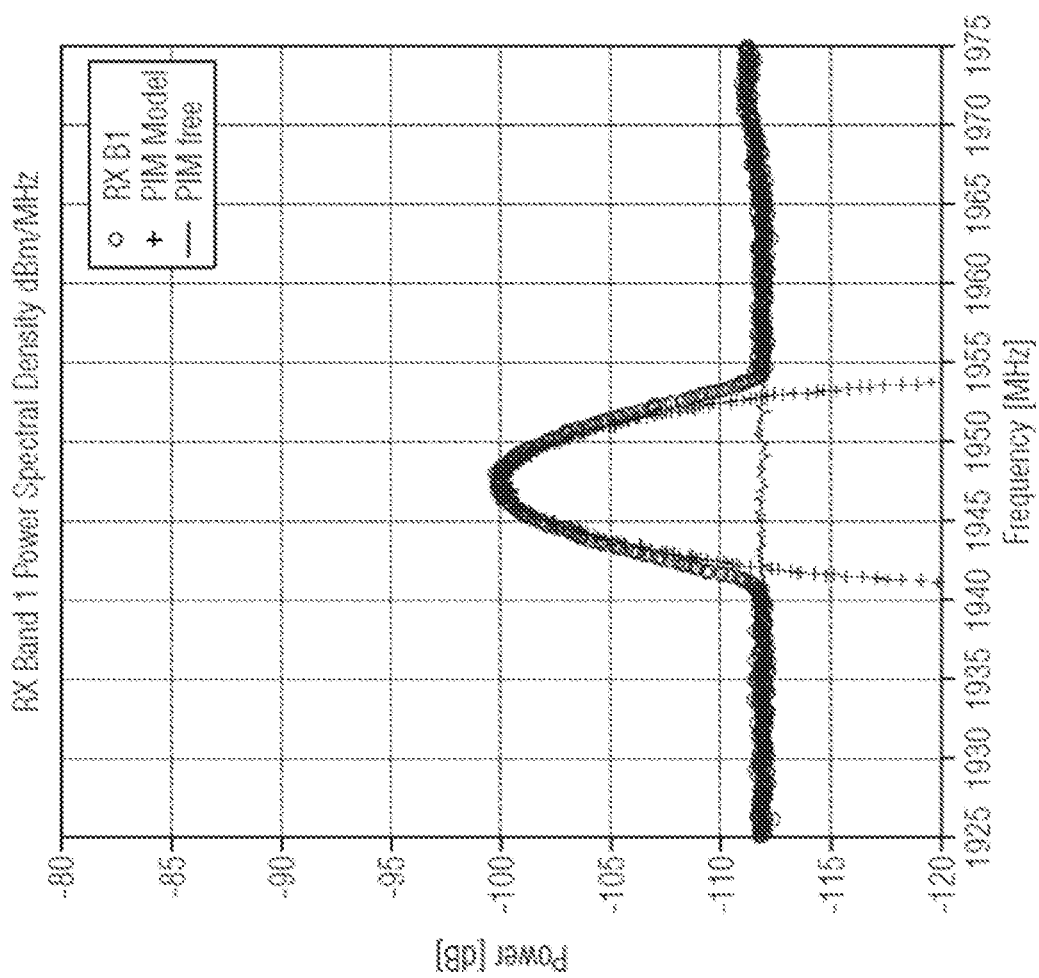
FIG. 10 shows a simulation of PIM with application of CFR.

In some embodiments, the TX signal is captured, and then CFR is used to clip signal peaks before the signal is processed. The composite signal taking into account Crest Factor Reduction processing provides more accurate Passive Intermodulation modeling. Nevertheless, the error in PIM level is typically still acceptable even without application of CFR. A comparison is shown in FIG. 9 (without application of CFR) and FIG. 10 (with application of CFR). In these figures, the received RX signal is shown by circles "o", the PIM model is shown by crosses "+", and the PIM free signal obtained by subtracting the PIM model (crosses) from the RX signal (circles) is shown as a solid line. As can be seen from a comparison of FIGS. 9 and 10, the PIM free signal with application of CFR (FIG. 10) is nearly flat, while the PIM free signal without application of CFR (FIG. 9) shows a weak structure.

Figure 5:
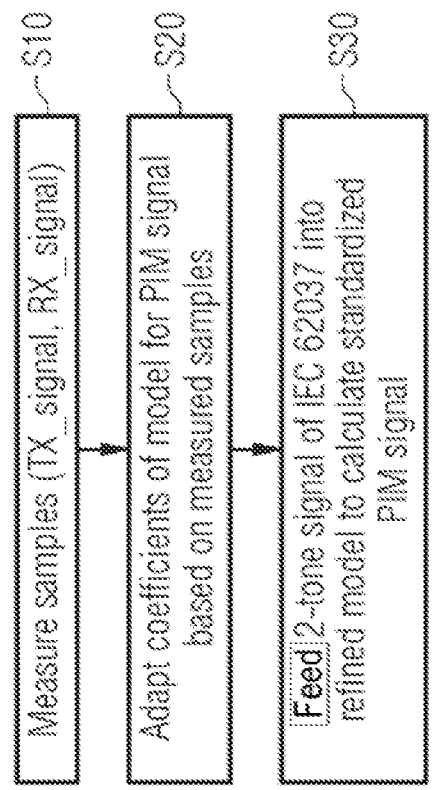
FIG. 5 shows a flow diagram showing processing operations of a method according to an example embodiment.
Figure 4:
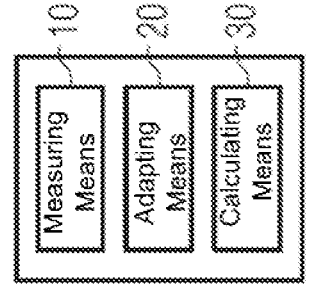
FIG. 4 shows an apparatus according to an example embodiment.

FIG. 4 shows an apparatus according to an embodiment. The apparatus may be an Operation & Maintenance Center or an element thereof such as a PIM estimating unit. FIG. 5 shows a method according to an embodiment. The apparatus according to FIG. 4 may perform the method of FIG. 5 but is not limited to this method. The method of FIG. may be performed by the apparatus of FIG. 4 but is not limited to being performed by this apparatus.

The apparatus comprises measuring means 10, adapting means 20, and calculating means 30. Each of measuring means 10, adapting means 20, and calculating means 30 may be a measuring processor, adapting processor, and calculating processor, respectively.

The measuring means 10 measures plural transmit signals and corresponding receive signals (S10). Each of the transmit signals is fed into an antenna system, and the corresponding receive signal is received from the antenna system when the respective transmit signal is fed into the antenna system.

The adapting means 20 adapts at least one coefficient of a basic model describing a relation between each of the plural transmit signals and respective passive intermodulation signal in order to obtain a refined model (S20). The adaptation is made such that, in the refined model, a discrepancy between the receive signals and the corresponding passive intermodulation signals for the plural transmit signals is less than a predefined threshold. A passive intermodulation signal corresponds to a receive signal if it is calculated based the refined model, wherein the transmit signal corresponding to the receive signal is input into the refined model.

The calculating means 30 calculates, based on the refined model, a standardized passive intermodulation signal as a third order intermodulation product for a standardized transmit signal (S30). The standardized transmit signal consists of two tones each of a power of 20 Watts (according to IEC 62037).

Apparatus, methods and computer program products will now be described for adapting a PIM model, which may comprise (but is not limited to) the above-described refined model, to deal with cross-band and/or inter-band non-linear terms, i.e. terms in the model produced by the presence of multiple different carrier frequencies or multiple different transmit bands, which may otherwise compromise virtual PIM measurement.

In the case of multi-band, wideband systems, the model typically depends on multiple "forms" of the same order with many possible combinations. An example model is shown below.

$$\text{PIM\_Signal} = \text{Alpha\_1} * \text{Tx\_Band1} * |\text{Tx\_Band1}|^2 + \\ \text{Alpha\_2} * \text{Tx} < \text{Band1} * |\text{Tx\_Band2}|^2 + \\ \text{Beta\_1} * \text{Tx\_Band1} * |\text{Tx\_Band1}|^4 + \\ \text{Beta\_2} * \text{Tx\_Band1} * |\text{Tx\_Band2}|^4 \text{Tx}.$$

Band1 denotes Tx_signals in Band1 and Tx_Band2 denotes Tx_signals in Band2. Alpha_1, Alpha_2, Beta_1 and Beta_2 are complex coefficients scaling the respective IMPn terms.

This adapting enables the model to be adapted for use in mitigating PIM that may occur multi-carrier, multi-band (wideband) radio systems, such as, but not limited to, cellular base stations based on for example FDD technology.

Methods of estimating PIM for different cross-band terms individually also helps in assessing an accurate mechanism of PIM that is present in the system i.e., due to triple tone or just two tones. This additional insight cannot be gleaned from commercial PIM tester equipment which just uses two tones, as per IEC 62037. This becomes especially important in cases where the PIM mechanism has a high frequency (transmit frequencies) dependence and hence can be used as an excellent diagnostic tool.

Figure 11:
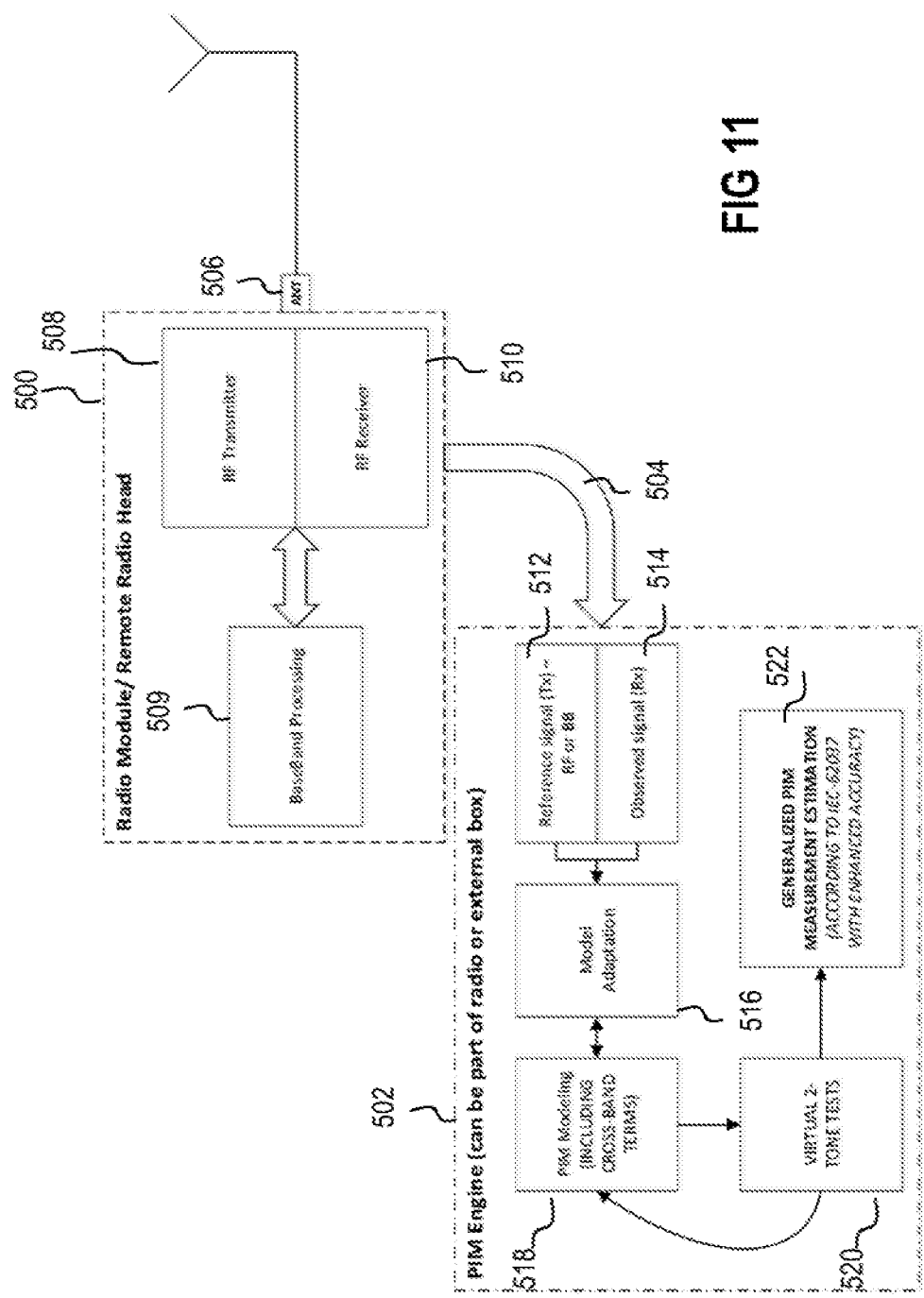

FIG. 11 shows a system comprising a radio module or remote radio head 500 coupled to, or in communication with, an apparatus hereafter referred to as a PIM engine 502 according to example embodiments. The radio module 500 may be remote from the PIM engine 502 and intercommunication may be by means of any suitable data transmissions means, wired or wireless, such as an IP network 504. Communication may be bidirectional. Communication may take advantage of free or unused data slots or packets otherwise used in other forms of communication between the radio head 500 and the PIM engine 503.

The radio head 500 may be a base station for cellular communications. For example the radio head 500 may be a 4G or 5G base station based on FDD technology whereby PIM products are introduced due to passive components such as duplexers, cables, connector interfaces and/or antennas. The PIM products may include true (single band) and cross-band (or inter-band) products, which may appear in the above-described model. The radio head 500 may comprise one or more antennas 506, an RF transmitter 508, an RF receiver 5110 and a baseband processing module 509. The radio head 500 may be the same or similar to the functionality shown in, and described with reference to, FIGS. 1 and 2.

Due to cross-band or inter-band (generically referred to as cross-band hereafter) products appearing in the above-described model, the model may in some cases be inaccurate, which may prevent accurate measurement, mitigation or cancellation of PIM.

The PIM engine 502 is a system or apparatus configured to account for said cross-band or inter-band products. The PIM engine 502 may comprise a reference signal module 512, an observed signal module 514, a model adaption module 516, a PIM modelling module 518, a virtual 2-tone test module 520 and a generalized PIM measurement estimation module 522. The functionality of said modules 512, 514, 516, 518, 520, 522 may be provided in fewer or greater modules, and can be provided in hardware, software, firmware or a combination thereof.

The reference signal module 512, the observed signal module 514 and the model adaptation module 516 are configured to provide substantially the same functionality as described above, i.e. to determine a refined model for use in PIM estimation. However, embodiments are applicable to adapting any model used in modelling PIM. As will be recalled, the transmit signal and the receive signal are simultaneously captured from the RF transmitter module 508 and the RF receiver 510 respectively, and the basic model is adapted by the model adaptation module 516 by modifying the coefficients to provide the refined model.

In example embodiments, the PIM modelling module 518 takes into account cross-band product terms that may introduce errors into the previous model. In this case, an adapted, generalized PIM model can be expressed algebraically as:

$$Y = [\text{IMP3 } \text{IMP3}(z-1) \text{IMP3}(z-2) \ldots \text{IMP3}(z-N) \\ \text{IMP3\_C } \text{IMP3\_C}(z-1) \text{IMP3\_C}(z-2) \ldots \\ \text{IMP3\_C}(z-N) \text{IMP5 } \text{IMP5}(z-1) \text{IMP5}(z-2) \ldots \\ \text{IMP5}(z-N) \text{IMP5\_C } \text{IMP5\_C}(z-1) \text{IMP5\_} \\ C(z-2) \ldots \text{IMP5\_C}(z-N) \ldots ] \quad (2)$$

where IMP3, IMP5, IMP3C and IMP5_C are column vectors and IMP3, IMP5 (in general IMPn) are true IMPn terms. e.g.: $\text{IMP3} = X1 \cdot |X1|^2$ & $\text{IMP5} = X1 \cdot |X1|^4$ and IMP3_C, IMP5_C (in general IMPn_C) are cross IMPn terms. e.g.: $\text{IMP3\_C} = X1 \cdot |X2|^2$ & $\text{IM5\_C} = X1 \cdot |X2|^4$.

Note that in a multi-band context, X1 denotes a carrier frequency A or Band A and X2 denotes a carrier frequency B or a different Band B. Any combination of X1 and X2 is possible to form the IMPn_C terms. The ones given above are only examples.

As before:

$$W = \begin{bmatrix} [w0] \\ [w1] \\ \ldots \\ [wm] \end{bmatrix}$$

W is the coefficient vector. Each wi weights the corresponding column in (1).

As before, the PIM estimation=$Y^*W$ \quad (3)

Coefficients can be updated using Least Mean Square (LMS) technique:

$$W = (\text{hermitian\_transpose}(Y) \cdot Y)^{-1} \cdot (\text{hermitian\_transpose} \\ (Y) \cdot \text{Receive Signal}).$$

When virtually replacing the transmit signal by two test tones of 20 W each, the true IMPn terms can be generated with a minimum of only two carriers, which is a straightforward proposition. However, extending this to the IMPn_C cross terms present in (2) is not straightforward as some IMPn_C terms may be generated only when there are more than two carriers. Some IMPn_C terms may require a minimum of three carriers, while some may require four carriers, five carriers and so on. To circumvent this problem, example embodiments normalize IMPn_C terms (which require more than two carriers to be generated) to IMPn terms (which require only a minimum of two carriers) so that we can virtually replace the transmit signal by two test tones of 20 W each, thus satisfying IEC 62037 standard.

Example embodiments involve finding the minimum number of carriers (tones) M that are required to generate an IMPn_C term. When determined, example embodiments involve normalizing the total power (40 W) of M against the total power (40 W) with two tones of 20 W each, and the normalized factor may be adapted as an "offset" to the estimated PIM level so that IEC 62037 may be satisfied, using:

$$IMPn_c \text{ Offset} = 10 \cdot \log_{10}\left(\left(\frac{2}{M}\right)^n\right) \quad (4)$$

where IMPn_C Offset is obtained as a normalization factor with respect to two tones of 20 W each (40 W) total power, n is the intermodulation product order and M is the minimum number of carriers or tones needed for the IMPn_C term.

The accompanying Appendix, the entire contents of which form part of the present disclosure, provides algebraic proof for some of the IMP3, IMP5, IMP3_C and IMP5_C terms used herein, for example in Nokia AirScale radios.

The theoretical derivation of the figures shown in the Appendix may be verified using simulation. FIG. 12 shows a table, where theoretical and simulated offsets are seen to closely correspond when there are three or more transmit carrier frequencies. Having found the "offset" for each IMPn term, the offset may be applied to the PIM measurement estimation from (3) for each IMPn & IMPn_C term.

Figure 14A:
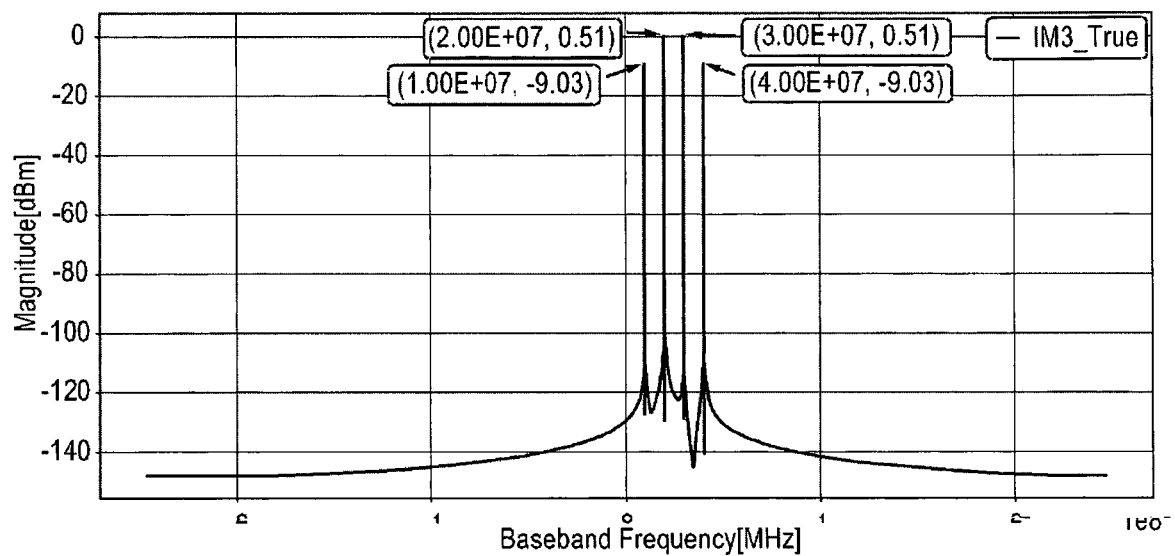
FIGS. 14A and 14B show two simulated waveforms indicating that a theoretical offset referred to in the FIG. 12 table would be appropriate to add.
Figure 14B:
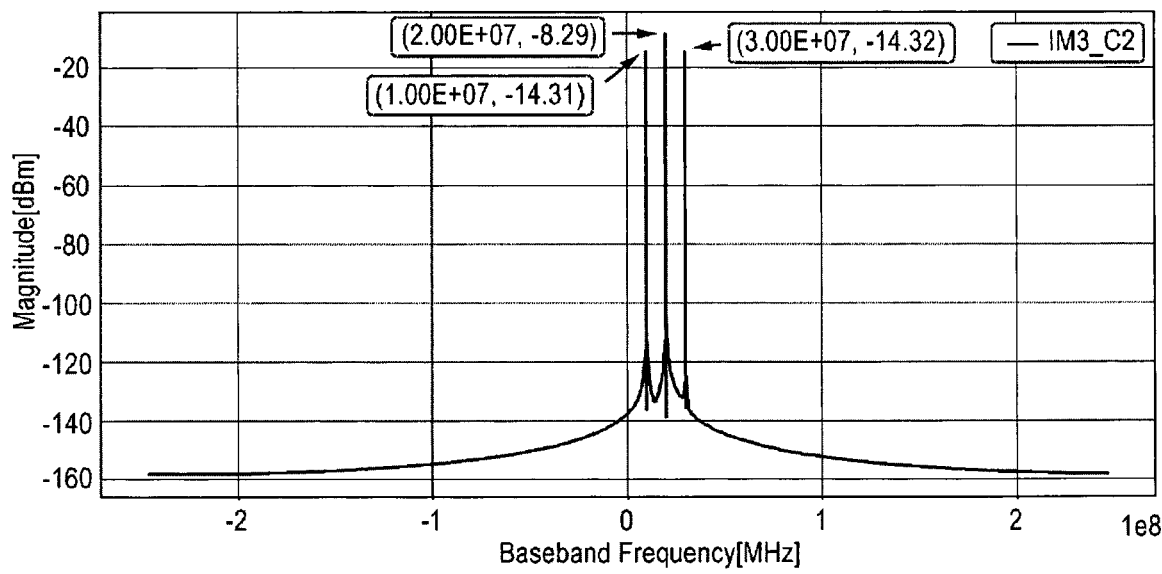

FIGS. 14A and 14B respectively show waveforms for the IMP3 and IMP3_C2 simulated results referred to in the FIG. 12 table.

Referring to FIG. 14A, this waveform refers to a simulation with two fundamental baseband frequencies belonging to the same band (X1) at 20 MHz (f1) and 30 MHz (f2), with IMP3 True products at 10 MHz (2f1−f2) and 40 MHz (2f2−f1). We are only interested in 2f1−f2 in the uplink. The function X1·|X1|² generates f1, f2, 2f1−f2 & 2f2−f1.

Referring to FIG. 14B, this waveform shows only the baseband frequencies belonging to the X1 band. The frequency f1 is one of the fundamental frequencies at 20 MHz (f2 and f3 belonging to X2 band are not shown), f1+f2−f3 at 10 MHz is the IMP3_C2 product that falls in our interested portion of the uplink, and f1+f3−f2 at 30 MHz is the IMP3_C2 product that is undesired (hence filtered). The function X1·|X2|² generates f1, f1+f2−f3 and f1+f3−f2.

The carrier frequencies (f1, f2 & f3) are input to non-linear functions in simulation and the output level at the desired IMP3 product is observed. The delta between IMP3_C2 and IMP3 at 10 MHz is 5.29 dB from the simulated graphs. Theoretically, using the formula given in (3), we obtain 5.28 dB which validates the formula.

Finally, the worst case PIM measurement results may be reported as:

$$\text{Reported\_PIM}_{IM3} = \min(PIM_{IM3} + \text{Offset}_{IM3},$$
$$PIM_{IM3_{C1}} + \text{Offset}_{IM3_{C1}}, PIM_{IM3_{C2}} + \text{Offset}_{IM3_{C2}}, \dots )$$

-continued
$$\text{Reported\_PIM}_{IM5} = \min(PIM_{IM5} + \text{Offset}_{IM5},$$
$$PIM_{IM5_{C1}} + \text{Offset}_{IM5_{C1}}, PIM_{IM5_{C2}} + \text{Offset}_{IM5_{C2}}, \dots )$$

Note that the min( ) function is used above, because it is assumed that the PIM measurement results are reported as positive dBc values. If the PIM measurement results are reported as negative dBc values, max( ) function should be used. Additionally, one may customize reporting to include a PIM measurement level for each individual term/mechanism. This provides excellent insight on the PIM mechanism (e.g. triple tone), especially if the PIM source is highly frequency dependent and hence can be used as a diagnostic tool.

Example embodiments have been implemented on Nokia AirScale radios and the reported PIM measurement results match very closely with the known calibrated PIM source presented to the antenna connector of the radio.

Example test conditions were as follows:
Tx1 LTE5 1932.5 MHz 10 W
Tx2 LTE5 1982.5 MHz 10 W
Tx3 LTE5 2122.5 MHz 10 W
Tx4 LTE5 2172.5 MHz 10 W
IMP3 lands on 1882.5 MHz
Known, calibrated PIM presented to ANT connector: 124.5 dBc IMP3
Reported PIM values:
$PIM_{IMP3}$+Offset$_{IMP3}$=124.8+0=124.8 dBc
$PIM_{IMP3\ldots C2}$+Offset$_{IMP3\ldots C2}$=129.08+(−5.28)=123.8 dBc
Reported_PIM$_{IMP3}$=min (124.8, 123.8)=123.8 dBc It will be noted that the reported_PIM$_{IMP3}$ is very close to the known, calibrated PIM presented to the antenna connector which shows that, without the method presented in example embodiments, reported values would be inaccurate. Inaccuracy mainly arises from PIM$_{IMP3\ldots C2}$ if the −5.28 dB offset was not included. For example, it is quite possible that PIM$_{IMP3\ldots C2}$ may actually contribute more than PIM$_{IMP3}$. Without applying the offset to PIM$_{IMP3\ldots C2}$, reported result is inaccurate.

Figure 6:
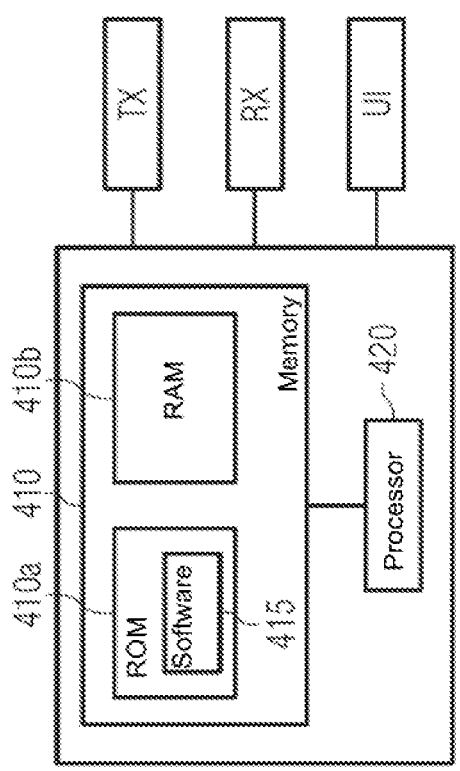
FIG. 6 shows an apparatus according to an example embodiment.

FIG. 6 shows an apparatus according to an embodiment. The apparatus may provide the functional modules indicated in FIG. 11. The apparatus comprises at least one processor 420 and at least one memory 410 directly or closely connected to the processor. The memory 410 includes at least one random access memory (RAM) 410b and at least one read-only memory (ROM) 410a. Computer program code (software) 415 is stored in the ROM 410a. The apparatus may be connected to a TX path and a RX path of a base station in order to obtain the respective signals. However, in some embodiments, the TX signals and RX signals are input as data streams into the apparatus. The apparatus may be connected with a user interface UI for instructing the apparatus and/or for outputting the results (e.g. the estimated PIM). However, instead of by a UI, the instructions may be input e.g. from a batch file, and the output may be stored in a non-volatile memory. The at least one processor 420, with the at least one memory 410 and the computer program code 415 are arranged to cause the apparatus to at least perform at least the method according to FIG. 5.

Figure 13:
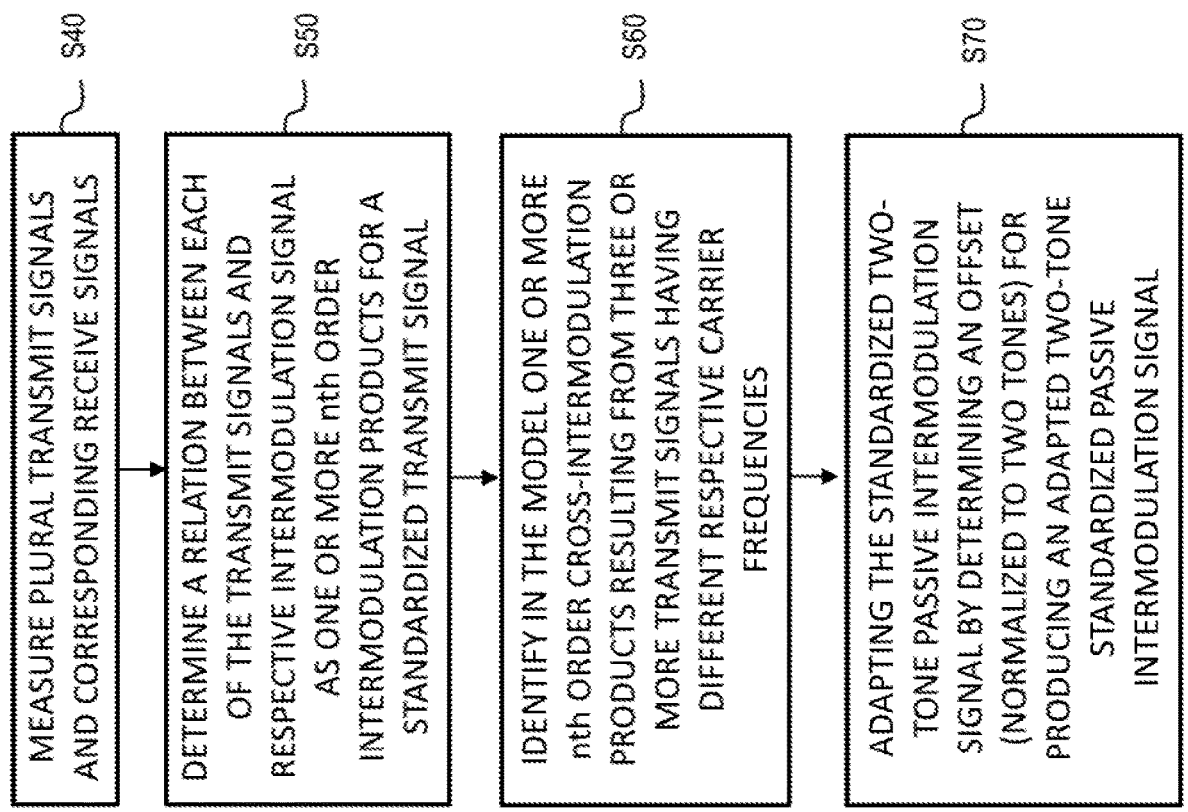
FIG. 13 shows a flow diagram showing processing operations of a method according to an example embodiment.

FIG. 13 is a flow diagram showing processing operations that may be performed by the FIG. 6 apparatus in adapting the two-tone standardized PIM signal. A first operation S40 may comprise measuring plural transmit signals and corresponding receive signals. A second operation S50 may comprise determining, using a model describing a relation between each of the plural transmit signals and a respective passive intermodulation signal, a standardized passive intermodulation signal as one or more $n^{th}$ order intermodulation products for a standardized transmit signal consisting of two tones each of a power of substantially 20 Watts. A third operation S60 may comprise identifying in the model one or more $n^{th}$ order cross-intermodulation products resulting from three or more transmit signals having different respective carrier frequencies. A fourth operation S70 may comprise, responsive to the identification, adapting the standardized two-tone passive intermodulation signal by determining an offset for producing an adapted two-tone standardized passive intermodulation signal.

It will be appreciated that certain operations may be modified or omitted. Further operations may be involved. The numbering of operations is not necessarily indicative of the order of processing.

In some embodiments, the adaption means may be configured to calculate the offset by determining a minimum number of tones M required to generate the one or more nth order cross-intermodulation products and normalizing the total power of the M tones against the total power for the two tones of substantially 40 Watts. The adaption means may determine the offset using:

$$IMPn_c \text{ Offset} = 10 \cdot \log_{10}\left(\left(\frac{2}{M}\right)^n\right)$$

where n is the intermodulation order.

The passive intermodulation signal may comprise at least one of true and cross intermodulation products 3rd order, true and cross intermodulation products of 5th order, and true and cross intermodulation products of 7th order, and the model comprises the respective at least one of:

True IMP3=TX_SIGNAL_F_1*|TX_SIGNAL_F_1|²;
Cross IMP3=TX_SIGNAL_F_1*|TX_SIGNAL_F_2|²;
True IMP5=TX_SIGNAL_F_1*|TX_SIGNAL_F_1|⁴;
Cross IMP5=TX_SIGNAL_F_1*|TX_SIGNAL_F_2|⁴; and
True IMP7=TX_SIGNAL_F_1*|TX_SIGNAL_F_1|⁶;
Cross IMP7=TX_SIGNAL_F_1*|TX_SIGNAL_F_2|⁶;
wherein
IMP3, IMP5, and IMP7 are the intermodulation products of 3rd, 5th, and 7th order, respectively;
TX_SIGNAL_F_1 is a transmission signal of a first carrier frequency or first transmission band; and
TX_SIGNAL_F_2 is a transmission signal of a second, different carrier frequency or second, different transmission band.

The determined offset may be provided from the PIM engine 502 to a remote location, such as the radio head 500. The determination and provision may be performed periodically. The provision may for example be effective to update a look-up table (LUT) stored at the radio head 500 using the offset to maintain an accurate figure of PIM for mitigation purposes. The PIM engine 5023 may be provided in an Operation & Maintenance Center or an element thereof such as a PIM estimating unit, which may also be used for storing the data for quality control purposes.

Embodiments herein do not disrupt live traffic, can perform triple tone IMP measurement, offer high accuracy, even at band edges, in the presence of live modulated signals. In the case of three modulated tones (carriers) there may for example be one modulated signal or tone in a first band and two modulated signals or tones in a second band.

Figure 7:
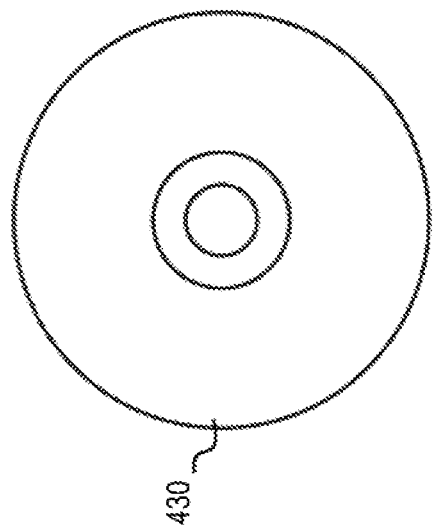
FIG. 7 shows a non-transitory media according to an example embodiment.

FIG. 7 shows a non-transitory media 430 according to some embodiments. The non-transitory media 430 is a computer readable storage medium. It may be e.g. a CD, a DVD, a USB stick, a blue ray disk, etc. The non-transitory media 430 stores computer program code causing an apparatus to perform the method of FIG. 5 and/or FIG. 13 when executed by a processor such as processor 420 of FIG. 6.

One piece of information may be transmitted in one or plural messages from one entity to another entity. Each of these messages may comprise further (different) pieces of information.

Names of network elements, protocols, and methods are based on current standards. In other versions or other technologies, the names of these network elements and/or protocols and/or methods may be different, as long as they provide a corresponding functionality. For example, embodiments may be deployed in 2G/3G/4G/5G networks and further generations of 3GPP but also in non-3GPP radio networks such as WiFi. Accordingly, a base station may be a BTS, a NodeB, a eNodeB, a WiFi access point etc.

A memory may be volatile or non-volatile. It may be e.g. a RAM, a sram, a flash memory, a FPGA block ram, a DCD, a CD, a USB stick, and a blue ray disk. If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware. It does not necessarily mean that they are based on different software. That is, each of the entities described in the present description may be based on different software, or some or all of the entities may be based on the same software. Each of the entities described in the present description may be embodied in the cloud.

According to the above description, it should thus be apparent that example embodiments provide, for example, a PIM estimation device, or a component thereof, an apparatus embodying the same, a method for controlling and/or operating the same, and computer program(s) controlling and/or operating the same as well as mediums carrying such computer program(s) and forming computer program product(s). Such a PIM estimation device may be incorporated e.g. in a Nokia Airframe expandable base station.

Implementations of any of the above described blocks, apparatuses, systems, techniques or methods include, as non-limiting examples, implementations as hardware, software, firmware, special purpose circuits or logic, general purpose hardware or controller or other computing devices, or some combination thereof. Some embodiments may be implemented in the cloud.

It is to be understood that what is described above is what is presently considered the preferred embodiments. However, it should be noted that the description of the preferred embodiments is given by way of example only and that various modifications may be made without departing from the scope as defined by the appended claims.

APPENDIX

Algebraic proof for some of IMP3, IMP5, IMP3_C and IMP5_C terms used herein, for example in Nokia AirScale radios.

IMP3, IMP5 are the true intermodulation products of 3rd and 5th order, respectively; and IMP3_C and IMP5_C are the cross intermodulation products of $3^{rd}$ and $5^{th}$ order, respectively.

By induction, this extends to any IMn and IMn_C terms, where n is an odd integer greater than 2.

In expressions below, X1 denotes carrier frequency A or Band A and X2 denotes carrier frequency B or Band B and Xn' denotes conjugate of Xn.

1. IMP3=X1·X1·X1'
   Let X1=$e^{jf1}$+$e^{jf2}$
   ∴IM3=($e^{jf1}$+$e^{jf2}$)*($e^{jf1}$+$e^{jf2}$)*($e^{-jf1}$+$e^{-jf2}$)
   IMP3 product (ignoring fundamentals): $e^{j(2f1-f2)}$+$e^{j(2f2-f1)}$
   M:2
   Offset=10*log 10$((2/2)^3)$=0 dB 2. IMP3_C1=X1·X1·X2'
   Let X1=$e^{jf1}$, X2=$e^{jf2}$
   ∴IM3_C1=$e^{jf1}$*$e^{jf1}$*$e^{-jf2}$
   IMP3 product: $e^{j(2f1-f2)}$
   M:2
   Offset=10*log 10$((2/2)^3)$=0 dB 3. IMP3_C2=X1·X2·X2'
   Let X1=$e^{jf1}$, X2=$e^{jf2}$+$e^{jf1}$
   ∴IM3_C2=$e^{jf1}$*($e^{jf2}$+$e^{jf1}$)*($e^{-jf2}$+$e^{-jf2}$)
   IMP3 product (ignoring fundamental): $e^{j(f1+f2-f2)}$+$e^{j(f1+f2-f2)}$
   M:3
   Offset=10*log 10$((2/3)^3)$=−5.28 dB 4. IMP5=X1·X1·X1'·X1·X1'
   Let X1=$e^{jf1}$+$e^{jf2}$
   ∴IM5=($e^{jf1}$+$e^{jf2}$)*($e^{jf1}$+$e^{jf2}$)*($e^{-jf1}$+$e^{-jf2}$)*($e^{jf1}$+$e^{jf2}$)*($e^{-jf1}$+$e^{-jf1}$)
   IMP5 product (ignoring fundamentals & IM3): $e^{j(2f1-2f2)}$+$e^{j(2f2-2f1)}$
   M:2
   Offset=10*log 10$((2/2)^5)$=0 dB 5. IMP5_C1=X1·X2·X2'·X2·X2'
   Let X1=$e^{jf1}$, X2=$e^{jf2}$+$e^{jf1}$
   ∴IM5_C1=$e^{jf1}$*($e^{jf2}$+$e^{jf2}$)*($e^{-jf2}$+$e^{-jf2}$).*($e^{jf2}$+$e^{jf2}$)*($e^{-jf2}$+$e^{-jf2}$)
   IMP5 product (ignoring fundamentals & IMP3): $e^{j(f1+2f2-2f2)}$+$e^{j(f1+2f2-2f2)}$
   M:3
   Offset=10*log 10$((2/3)^5)$=−8.8 dB 6. IMP5_C2=X2·X1·X1'·X1·X1'
   Let X1=$e^{jf1}$+$e^{jf2}$·X2=$e^{jf2}$
   IM5_C2 ($e^{jf2}$+$e^{jf2}$)*($e^{-jf1}$+$e^{-jf2}$)*($e^{jf1}$+$e^{jf2}$)*($e^{-jf1}$+$e^{-jf2}$) *$e^{jf2}$
   IMP5 product (ignoring fundamentals & IMP3): $e^{j(f2+2f1-2f2)}$+$e^{j(f3+2f2-2f1)}$
   M:3
   Offset=10*log 10$((2/3)^3)$=−8.8 dB 7. IMP5_C3=X1·X1·X1·X1'·X2'
   Let X1=$e^{jf1}$+$e^{jf2}$, X2=$e^{jf2}$
   ∴IMP5_C3=($e^{jf1}$+$e^{jf2}$)*($e^{jf1}$+$e^{jf2}$)*($e^{jf1}$+$e^{jf2}$)*($e^{-jf1}$+$e^{jf2}$)*$e^{-jf2}$
   IMP5 product (ignoring fundamentals & IMP3): $e^{j(2f1-f2-f3)}$+$e^{j(3f1-f1-f3)}$
   M:3
   Offset=10*log 10$((2/3)^5)$=−8.8 dB 8. IMP5_C4=X1·X1·X2'·X2·X2'
   Let X1=$e^{jf1}$, X2=$e^{jf2}$+$e^{jf2}$
   ∴IM5_C4=$e^{jf1}$*$e^{jf1}$*($e^{-jf2}$+$e^{-jf2}$)*($e^{jf2}$+$e^{jf2}$)*($e^{-jf2}$+$e^{jf2}$)
   IMP5 product (ignoring fundamentals & IMP3): $e^{j(2f1+f2-2f2)}$+$e^{j(2f1+f2-2f2)}$+$e^{j(2f1+f2-2f2)}$
   M:3
   Offset=10*log 10$((2/3)^5)$=−−8.8 dB 9. IMP5_C5=X1·X1'·X2·X2·X2'
   Let X1=$e^{jf1}$+$e^{jf2}$, X2=$e^{jf2}$+$e^{jf4}$
   ∴IM5_C5=($e^{jf1}$+$e^{jf2}$)*($e^{-jf1}$+$e^{-jf2}$)*($e^{jf2}$+$e^{jf2}$)*($e^{jf2}$+$e^{jf2}$)*($e^{-jf2}$+$e^{jf4}$)
   IMP5 product (ignoring fundamentals & IMP3): $e^{j(f1+2f2-f2-f4)}$+$e^{j(2f1+f4-f2-f2)}$
   M:4
   Offset=10*log 10$((2/4)^5)$=−15.05 dB.

10. IMP5_C6=X1·X1·X1'·X2·X2'
    Let X1=$e^{jf1}$+$e^{jf2}$, X2=$e^{jf2}$+$e^{jf4}$
    ∴IM5_C6=($e^{jf1}$+$e^{jf2}$)*($e^{jf1}$+$e^{jf2}$)*($e^{-jf1}$+$e^{-jf2}$)*($e^{jf2}$+$e^{jf4}$)*($e^{-jf2}$+$e^{-jf4}$)
    IMP5 product (ignoring fundamentals & IMP3): $e^{j(2f1+f2-f2-f4)}$+$e^{j(2f1+f4-f2-f)}$
    M:4
    Offset=10*log 10$((2/4)^3)$=−15.05 dB.

The invention claimed is:

1. An apparatus, comprising:
   means for testing in a live network with live traffic by using means to select the otherwise unused data slots or packets;
   means for measuring plural transmit signals and corresponding receive signals;
   means for determining, using a model describing a relation between each of the plural transmit signals and a respective passive intermodulation signal, a standardized passive intermodulation signal as one or more $n^{th}$ order intermodulation products for a standardized transmit signal comprising two tones each of a power of substantially 20 Watts;
   means for identifying in the model one or more $n^{th}$ order cross-intermodulation products resulting from three or more transmit signals having different respective carrier frequencies; and
   means responsive to the identification for adapting the standardized two-tone passive intermodulation signal by determining an offset for producing an adapted two-tone standardized passive intermodulation signal,
   wherein n is an odd integer greater than two,
   wherein the live traffic comprises regularly transmitted signals on which testing is performed without disrupting service of the live network.

2. The apparatus of claim 1, wherein the adaption means is configured to calculate the offset by determining a minimum number of tones M required to generate the one or more $n^{th}$ order cross-intermodulation products and normalizing the total power of the M tones against the total power for the two tones of substantially 40 Watts.

3. The apparatus of claim 2, wherein the adaption means determines the offset using:

$$IMPn_c \text{ Offset} = 10 \cdot \log_{10}\left(\left(\frac{2}{M}\right)^n\right)$$

where n is the intermodulation order.

4. The apparatus of claim 1, wherein the passive intermodulation signal comprises at least one of true and cross intermodulation products 3rd order, true and cross intermodulation products of 5th order, and true and cross intermodulation products of 7th order, and the model comprises the respective at least one of
True IMP3=TX_SIGNAL_F_1*|TX_SIGNAL_F_1|$^2$;
Cross IMP3=TX_SIGNAL_F_1*|TX_SIGNAL_F_2|$^2$;
True IMP5=TX_SIGNAL_F_1*|TX_SIGNAL_F_1|$^4$;
Cross IMP5=TX_SIGNAL_F_1*|TX_SIGNAL_F_2|$^4$; and
True IMP7=TX_SIGNAL_F_1*|TX_SIGNAL_F_1|$^6$;

Cross IMP7=TX_SIGNAL_F_1*|TX_SIGNAL_F_2|$^6$;
wherein:
IMP3, IMP5, and IMP7 are the intermodulation products of 3rd, 5th, and 7th order, respectively;
TX_SIGNAL_F_1 is a transmission signal of a first carrier frequency or first transmission band; and
TX_SIGNAL_F_2 is a transmission signal of a second, different carrier frequency or second, different transmission band.

5. The apparatus of claim 1, wherein the model is a refined model derived by adapting at least one coefficient of a basic model describing a relation between each of the plural transmit signals and a respective passive intermodulation signal to obtain the refined model such that, in the refined model, a discrepancy between the receive signals and the corresponding passive intermodulation signals for the plural transmit signals is less than a predefined threshold, and wherein the standardized passive intermodulation system is calculated based on the refined model.

6. The apparatus of claim 5, wherein each of the transmit signals is fed into an antenna system, and the corresponding receive signal is received from the antenna system when the respective transmit signal is fed into the antenna system.

7. The apparatus of claim 5, wherein the discrepancy is at least one of a sum of the absolute values of differences between each of the receive signals and the corresponding passive intermodulation signal, a sum of the squares of the differences between each of the receive signals and the corresponding passive intermodulation signal, and a maximum of the differences between each of the receive signals and the corresponding passive intermodulation signal.

8. The apparatus of claim 5, wherein the adapting of the at least one coefficient comprises at least one of a least mean square algorithm, a minimum mean square algorithm, and a recursive least square algorithm.

9. The apparatus of claim 5, wherein the transmit signals and the corresponding receive signals are measured at a transceiver connected to the antenna.

10. The apparatus of claim 9, wherein the receive signals are filtered by a receive filter with a receive filter function having a receive bandwidth located around a receive center frequency, and the transmit signals are comprised in a transmit band located around a transmit center frequency.

11. The apparatus of claim 1, wherein
the transmit signals are measured as an output of a transmit baseband module connected to the antenna system via a modulation unit, and
the corresponding receive signals are measured as an input of a receive baseband module connected to the antenna system via a demodulation unit.

12. The apparatus of claim 1, further comprising means for applying the offset to produce the adapted two-tone standardized passive intermodulation signal and applying it to the one or more receive signals for mitigating passive intermodulation.

13. A method, comprising, in a live network comprising live traffic:
performing testing by using the free or unused data slots or packets, by:
measuring plural transmit signals and corresponding receive signals;
determining, using a model describing a relation between each of the plural transmit signals and a respective passive intermodulation signal, a standardized passive intermodulation signal as one or more n$^{th}$ order intermodulation products for a standardized transmit signal comprising two tones each of a power of substantially 20 Watts;
identifying in the model one or more n$^{th}$ order cross-intermodulation products resulting from three or more transmit signals having different respective carrier frequencies; and
responsive to the identification, adapting the standardized two-tone passive intermodulation signal by determining an offset for producing an adapted two-tone standardized passive intermodulation signal,
wherein n is an odd integer greater than two,
wherein the live traffic comprises regularly transmitted signals on which testing is performed without disrupting service of the live network.

14. The method of claim 13, wherein the adapting comprises calculating the offset by determining a minimum number of tones M required to generate the one or more n$^{th}$ order cross-intermodulation products and normalizing the total power of the M tones against the total power for the two tones of substantially 40 Watts.

15. The method of claim 14, wherein the adapting determines the offset using:

$$IMPn_c \text{ Offset} = 10 \cdot \log_{10}\left(\left(\frac{2}{M}\right)^n\right)$$

where n is the intermodulation order.

16. The method of claim 13, wherein the passive intermodulation signal comprises at least one of true and cross intermodulation products 3rd order, true and cross intermodulation products of 5th order, and true and cross intermodulation products of 7th order, and the model comprises the respective at least one of
True IMP3=TX_SIGNAL_F_1*|TX_SIGNAL_F_1|$^2$;
Cross IMP3=TX_SIGNAL_F_1*|TX_SIGNAL_F_2|$^2$;
True IMP5=TX_SIGNAL_F_1*|TX_SIGNAL_F_1|$^4$;
Cross IMP5=TX_SIGNAL_F_1*|TX_SIGNAL_F_2|$^4$; and
True IMP7=TX_SIGNAL_F_1*|TX_SIGNAL_F_1|$^6$;
Cross IMP7=TX_SIGNAL_F_1*|TX_SIGNAL_F_2|$^6$;
wherein:
IMP3, IMP5, and IMP7 are the intermodulation products of 3rd, 5th, and 7th order, respectively;
TX_SIGNAL_F_1 is a transmission signal of a first carrier frequency or first transmission band; and
TX_SIGNAL_F_2 is a transmission signal of a second, different carrier frequency or second, different transmission band.

17. The method of claim 13, wherein the model is a refined model derived by adapting at least one coefficient of a basic model describing a relation between each of the plural transmit signals and a respective passive intermodulation signal to obtain the refined model such that, in the refined model, a discrepancy between the receive signals and the corresponding passive intermodulation signals for the plural transmit signals is less than a predefined threshold, and wherein the standardized passive intermodulation system is calculated based on the refined model.

18. The method of claim 17, wherein the discrepancy is at least one of a sum of the absolute values of differences between each of the receive signals and the corresponding passive intermodulation signal, a sum of the squares of the differences between each of the receive signals and the corresponding passive intermodulation signal, and a maximum of the differences between each of the receive signals and the corresponding passive intermodulation signal.

19. A method of creating a work product comprising a look up table or array, comprising:
- performing testing in live traffic by selecting the otherwise unused data slots or packets to contain test data, said testing comprising:
  - measuring plural transmit signals and corresponding receive signals;
  - determining, using a model describing a relation between each of the plural transmit signals and a respective passive intermodulation signal, a standardized passive intermodulation signal as one or more $n^{th}$ order intermodulation products for a standardized transmit signal comprising two tones each of a power of substantially 20 Watts;
  - identifying in the model one or more $n^{th}$ order cross-intermodulation products resulting from three or more transmit signals having different respective carrier frequencies; and
  - responsive to the identification, adapting the standardized two-tone passive intermodulation signal by determining an offset for producing an adapted two-tone standardized passive intermodulation signal,
  - wherein n is an odd integer greater than two,
- wherein the live traffic comprises regularly transmitted signals on which testing is performed without disrupting service of the live network.

20. A non-transitory computer readable medium comprising program instructions stored thereon for performing a method, comprising, in a live network comprising live traffic:
- performing testing by using free or unused data slots or packets, by:
  - measuring plural transmit signals and corresponding receive signals;
  - determining, using a model describing a relation between each of the plural transmit signals and a respective passive intermodulation signal, a standardized passive intermodulation signal as one or more $n^{th}$ order intermodulation products for a standardized transmit signal comprising two tones each of a power of substantially 20 Watts;
  - identifying in the model one or more nth order cross-intermodulation products resulting from three or more transmit signals having different respective carrier frequencies; and
- responsive to the identification, adapting the standardized two-tone passive intermodulation signal by determining an offset for producing an adapted two-tone standardized passive intermodulation signal,
- wherein n is an odd integer greater than two,
- wherein the live traffic comprises regularly transmitted signals on which testing is performed without disrupting service of the live network.

21. An apparatus, comprising:
- at least one processor; and
- at least one memory including computer program code which, when executed by the at least one processor, causes the apparatus to:
- in a live network, perform testing in live traffic by selecting the otherwise unused data slots or packets to contain test data;
- measure plural transmit signals and corresponding receive signals;
- determine, using a model describing a relation between each of the plural transmit signals and a respective passive intermodulation signal, a standardized passive intermodulation signal as one or more $n^{th}$ order intermodulation products for a standardized transmit signal comprising two tones each of a power of substantially 20 Watts;
- identify in the model one or more $n^{th}$ order cross-intermodulation products resulting from three or more transmit signals having different respective carrier frequencies; and
- responsive to the identification, adapt the standardized two-tone passive intermodulation signal by determining an offset for producing an adapted two-tone standardized passive intermodulation signal,
- wherein n is an odd integer greater than two,
- wherein the live traffic comprises regularly transmitted signals on which testing is performed without disrupting service of the live network.

* * * * *